(12) United States Patent
Kim et al.

(10) Patent No.: US 9,076,983 B2
(45) Date of Patent: Jul. 7, 2015

(54) ORGANIC LIGHT-EMITTING DISPLAY DEVICE AND METHOD OF MANUFACTURING THE SAME

(71) Applicant: Samsung Display Co., Ltd., Yongin, Gyeonggi-do (KR)

(72) Inventors: Tae-Hyung Kim, Yongin (KR);
Byoung-Seong Jeong, Yongin (KR);
Se-Ho Lee, Yongin (KR)

(73) Assignee: Samsung Display Co., Ltd. (KR)

( * ) Notice: Subject to any disclaimer, the term of this patent is extended or adjusted under 35 U.S.C. 154(b) by 0 days.

(21) Appl. No.: 13/938,943

(22) Filed: Jul. 10, 2013

(65) Prior Publication Data
US 2014/0239262 A1    Aug. 28, 2014

(30) Foreign Application Priority Data

Feb. 25, 2013  (KR) .................... 10-2013-0020020

(51) Int. Cl.
*H01L 51/00*    (2006.01)
*H01L 51/52*    (2006.01)

(52) U.S. Cl.
CPC ........ *H01L 51/5212* (2013.01); *H01L 51/5228* (2013.01)

(58) Field of Classification Search
CPC ............ H01L 51/0545; H01L 51/0036; H01L 51/0541; H01L 51/5012
USPC ..................... 257/40, 462, E51.022
See application file for complete search history.

(56) References Cited

U.S. PATENT DOCUMENTS

| 6,861,008 | B1 | 3/2005 | De Steur et al. | |
|---|---|---|---|---|
| 7,221,095 | B2 * | 5/2007 | Yamazaki et al. | ............ 313/509 |
| 7,990,050 | B2 | 8/2011 | Eom | |
| 8,115,376 | B2 | 2/2012 | Fujioka et al. | |
| 2009/0302751 | A1 | 12/2009 | Hanawa | |

FOREIGN PATENT DOCUMENTS

| KR | 10-2004-0053949 | 6/2004 |
|---|---|---|
| KR | 10-2009-0020622 | 2/2009 |
| KR | 10-2009-0127220 | 12/2009 |
| KR | 10-2010-0028925 | 3/2010 |

* cited by examiner

*Primary Examiner* — Quoc Hoang
(74) *Attorney, Agent, or Firm* — Knobbe Martens Olson & Bear LLP (57) ABSTRACT

An organic light-emitting display device and a method of manufacturing the organic light-emitting display device are provided. The organic light-emitting display device includes: a substrate including first and second areas; a pixel electrode formed in the first area of the substrate; an auxiliary electrode formed in the second area of the substrate; an intermediate layer including an organic emission layer and formed on the pixel electrode and the auxiliary electrode; a first common electrode formed on the intermediate layer; and a second common electrode formed on the first common electrode, where the second common electrode and the auxiliary electrode contact each other through a contact hole which penetrates the first common electrode and the intermediate layer formed on the auxiliary electrode.

27 Claims, 6 Drawing Sheets

ORGANIC LIGHT-EMITTING DISPLAY DEVICE AND METHOD OF MANUFACTURING THE SAME

INCORPORATION BY REFERENCE TO ANY PRIORITY APPLICATIONS

Any and all applications for which a foreign or domestic priority claim 1s identified in the Application Data Sheet as filed with the present application are hereby incorporated by reference under 37 CFR 1.57.

This application claims the benefit of Korean Patent Application No. 10-2013-0020020, filed on Feb. 25, 2013, in the Korean Intellectual Property Office, the disclosure of which is incorporated herein in its entirety by reference.

BACKGROUND

1. Field

The present disclosure relates to an organic light-emitting display device and a method of manufacturing the same.

2. Description of the Related Technology

An organic light-emitting display apparatus typically includes an organic light-emitting diode (OLED) including a hole injection electrode, an electron injection electrode, and an organic emission layer between the hole and electron injection electrodes. The organic light emitting display apparatus is generally a self-emissive display apparatus in which light is emitted while excitons generated when holes injected by the hole injection electrode and electrons injected by the electron injection electrode are combined in the organic emission layer transit from an excited state to a ground state.

The organic light-emitting display device that is the self-emitting display device does not require an additional light source. Therefore, the organic light-emitting display device is driven at a low voltage, is made light and thin, has a wide view angle, a high contrast, and a fast response speed. Also, according to high-quality properties, the organic light emitting display device is receiving attention as a next generation display device.

In particular, in an active organic light-emitting display device having a top emission structure, light from an organic emission layer is emitted toward a common electrode. The common electrode is formed to be maximally thin. As the common electrode is thin, a resistance increases, and a voltage drops.

SUMMARY OF CERTAIN INVENTIVE ASPECTS

According to an aspect of the present invention, there is provided an organic light-emitting display device including: a substrate including first and second areas; a pixel electrode of the substrate; an auxiliary electrode of the substrate; an intermediate layer including an organic emission layer and formed on the pixel electrode formed in the first area and the auxiliary electrode formed in the second area; a first common electrode formed on the intermediate layer; and a second common electrode formed on the first common electrode, wherein the second common electrode and the auxiliary electrode contact each other through a contact hole which penetrates the first common electrode and the intermediate layer formed on the auxiliary electrode.

The intermediate layer formed on the auxiliary electrode may include a first contact hole exposing the auxiliary electrode. The first common electrode formed on the auxiliary electrode may include a second contact hole exposing the auxiliary electrode.

The first and second contact holes may be formed in the same size.

A thickness of the second common electrode may be larger than a thickness of the first common electrode.

The auxiliary electrode may be formed on the same layer as the pixel electrode.

The auxiliary electrode may include the same material as the pixel electrode.

The first and second common electrodes may have a light transmitting property and include magnesium (Mg) and silver (Al).

The pixel electrode may be a reflective electrode.

According to another aspect of the present invention, there is provided an organic light-emitting display device including: a substrate; a thin film transistor (TFT) formed on the substrate and including an active layer, a gate electrode, a source electrode, and a drain electrode; an organic light-emitting diode (OLED) in which a pixel electrode, an intermediate layer, and a common electrode are stacked, wherein the pixel electrode is electrically connected to one of the source and drain electrodes, the intermediate layer includes an organic emission layer, and the common electrode faces the pixel electrode and includes first and second common electrodes; and an auxiliary electrode which is formed on the same layer as the pixel electrode, wherein the second common electrode and the auxiliary electrode contact each other through a contact hole which penetrates the first common electrode and the intermediate layer formed on the auxiliary electrode.

A thickness of the second common electrode may be larger than a thickness of the first common electrode.

The auxiliary electrode and the pixel electrode may include the same material.

Light emitted from the OLED may be emitted toward the common electrode.

According to another aspect of the present invention, there is provided a method of manufacturing an organic light-emitting display device, including: providing a substrate including first and second areas; forming a pixel electrode in the first area of the substrate; forming an auxiliary electrode in the second area of the substrate; forming an intermediate layer including an organic emission layer on the pixel electrode and the auxiliary electrode; forming a first common electrode on the intermediate layer; forming a contact hole in a position corresponding to the second area to expose the auxiliary electrode; and forming a second common electrode on the first common electrode so that the second common electrode contacts the auxiliary electrode through the contact hole.

The formation of the contact hole may include: simultaneously forming first and second contact holes, wherein the first contact hole penetrates the intermediate layer formed on the auxiliary electrode and the second contact hole penetrates the first common electrode formed on the auxiliary electrode.

The first and second contact holes may substantially have the same size.

The formation of the contact holes may be performed in an atmosphere of an inert gas.

The formation of the contact hole may include: forming contact holes penetrating the first electrode and the intermediate layer formed on the auxiliary electrode by using a laser drilling method.

The formation of the pixel electrode and the formation of the auxiliary electrode may be simultaneously performed.

The auxiliary electrode may include the same material as the pixel electrode.

The auxiliary electrode and the pixel electrode may include a metal having a reflective property.

The formation of the first common electrode and the formation of the second common electrode may be performed in a vacuum.

The formation of the second common electrode may include: forming the second common electrode thicker than the first common electrode.

The formation of the first common electrode may include: forming the first common electrode including Mg and Al.

The formation of the second common electrode may include: forming the second common electrode including Mg and Al.

BRIEF DESCRIPTION OF THE DRAWINGS

The above and other features and advantages of the present invention will become more apparent by describing in detail certain embodiments thereof with reference to the attached drawings in which.

DETAILED DESCRIPTION OF CERTAIN INVENTIVE EMBODIMENTS

While certain embodiments are capable of various modifications and alternative forms, embodiments thereof are shown by way of example in the drawings and will herein be described in detail. It should be understood, however, that there is no intent to limit example embodiments to the particular forms disclosed, but on the contrary, example embodiments are to cover all modifications, equivalents, and alternatives falling within the scope of the invention. It will be understood that, although the terms first, second, third etc. may be used herein to describe various elements, components, regions, layers and/or sections, these elements, components, regions, layers and/or sections should not be limited by these terms. These terms are only used to distinguish one element, component, region, layer or section from another region, layer or section. The terminology used herein is for the purpose of describing particular embodiments only and is not intended to be limiting of example embodiments. As used herein, the singular forms "a," "an" and "the" are intended to include the plural forms as well, unless the context clearly indicates otherwise. It will be further understood that the terms "comprises" and/or "comprising" when used in this specification, specify the presence of stated features, integers, steps, operations, elements, and/or components, but do not preclude the presence or addition of one or more other features, integers, steps, operations, elements, components, and/ or groups thereof "/" used below may be interpreted as "and" or "or" according to situations. In the drawings, the thicknesses of layers and regions may be exaggerated for clarity. Like reference numerals in the drawings generally denote like elements. It will be understood that when an element, such as a layer, a region, or a substrate, is referred to as being "on" or "above" another element, it may be directly on, or intervening elements may be present.

Figure 1:
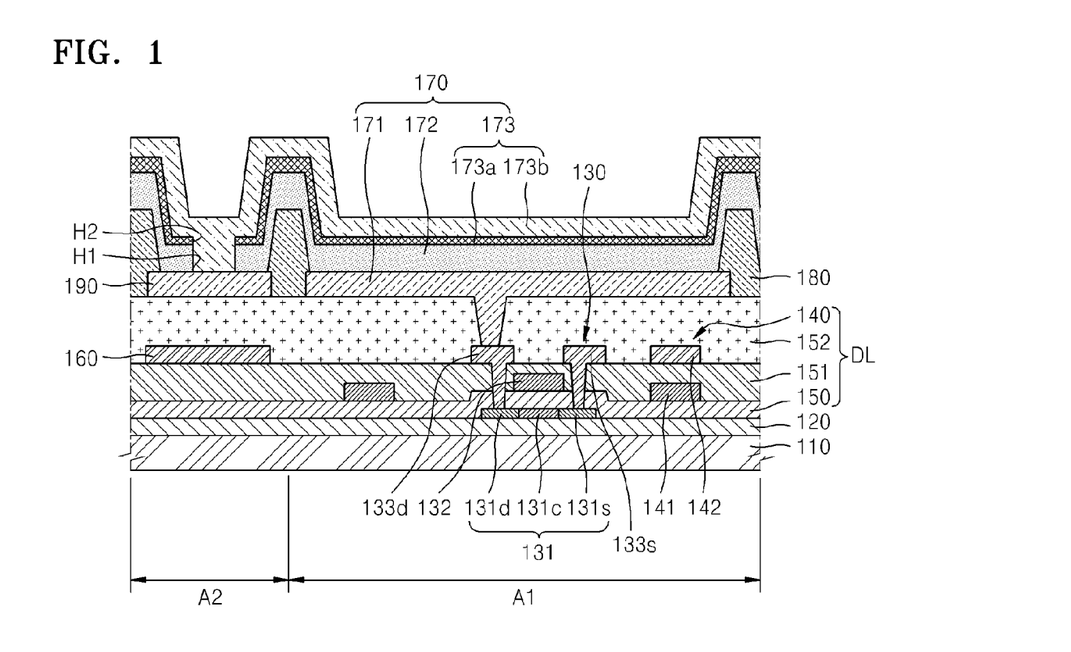
FIG. 1 is a schematic cross-sectional view illustrating an organic light-emitting display device according to an embodiment of the present invention.

FIG. 1 is a schematic cross-sectional view illustrating an organic light-emitting display device according to an embodiment of the present invention.

Referring to FIG. 1, the organic light-emitting display device includes a substrate 110 which comprises first and second areas A1 and A2 and on which a device/line (DL) layer is formed. An organic light-emitting diode (OLED) 170 is formed in a position corresponding to the first area A1 of the substrate 10 and includes a pixel electrode 171, an intermediate layer 172 including an organic emission layer, and a common electrode 173. An auxiliary electrode 190 is formed in a position corresponding to the area A2. The auxiliary electrode 190 may be included per one sub-pixel or per one pixel. The common electrode 173 includes first and second common electrodes 173a and 173b. The intermediate layer 172 and the first and second common electrodes 173a and 173b are disposed on the pixel electrode 171 of the OLED 170 and the auxiliary electrode 190. Also, the auxiliary electrode 190 contacts the second common electrode 173b.

The substrate 110 may be a flexible substrate and may be formed of a plastic having high heat-resistance and durability properties. However, the present invention is not limited thereto, and thus the substrate 110 may be formed of various types of materials such as metal, glass, etc.

A buffer layer 120 is formed on the substrate 110. The buffer layer 120 is to form a flat surface on the substrate 110 and prevent impurity elements from permeating into the substrate 110. The buffer layer 120 may be formed of a silicon nitride and/or a silicon oxide as a single layer or multiple layers The DL layer includes a driving thin film transistor (TFT) 130 driving the OLED 170, a capacitor 140, a switching TFT (not shown) electrically connected to the capacitor 140, and lines connected to the driving TFT 130 or the switching TFT or the capacitor 140. The driving TFT 130 is shown in FIG. 1 to be electrically connected to the OLED 170 in order to supply a current to the OLED 170. However, the organic light-emitting display device may also include the switching TFT electrically connected to the capacitor 140, as described above.

The driving TFT 130 may include an active layer 131, a gate electrode 132, a source electrode 133s, and a drain electrode 133d. A gate insulating layer 150 is interposed between the gate electrode 132 and the active layer 131 to insulate the gate electrode 132 and the active layer 131 from each other. Source and drain areas 131s and 131d doped with high-density impurities are formed at both edges of the active layer 131 so that a channel area 131c is formed between the source and drain areas 131s and 131d. The active layer 131 may include amorphous silicon, polysilicon, and oxide semiconductor.

The source and drain electrodes 133s and 133d are formed above the gate electrode 132 and a first interlayer insulating layer 151 is formed between the gate electrode 132 and the source and drain electrodes 133s and 133d. The source and drain electrodes 133s and 133d may be respectively electrically connected to the source and drain areas 131s and 131d of the active layer 131. A second interlayer insulating layer 152 is formed on the source and drain electrodes 133s and 133d.

A line layer 160 may be formed along with the source and drain electrodes 133s and 133d without an additional process for forming the line layer 160.

A top gate type TFT is shown in FIG. 1, but the present invention is not limited thereto. According to another embodiment, a bottom gate type TFT may be applied.

The capacitor 140 recharges a signal applied to the driving TFT 130 even after the switching TFT is switched off. The capacitor 140 includes first and second electrodes 141 and 142, and the first interlayer insulating layer 151 is interposed as a dielectric layer between the first and second electrodes 141 and 142. The first electrode 141 of the capacitor 140 may be formed on the same layer as the gate electrode 132, and the second electrode 142 may be formed on the same layer as the source and drain electrodes 133s and 133d. The first electrode 141 is formed together with the gate electrode 132, and the second electrode is formed together with the source and drain electrodes 133s and 133d, thereby reducing the number of processes.

The OLED 170 is disposed in the first area A1 of the substrate 110 and includes the pixel electrode 171, the common electrode 173, and the intermediate layer 172. The pixel electrode 171 is electrically connected to one of the source and drain electrodes 133s and 133d of the driving TFT 130, and the common electrode 173 is disposed opposite to the pixel electrode 171. The intermediate layer 172 includes the organic emission layer and is interposed between the pixel electrode 171 and the common electrode 173.

The organic emission layer may include a low or high molecular organic material. If the organic emission layer includes the low molecular organic material, the intermediate layer 172 may further include a hole transport layer (HTL) and a hole injection layer (HIL) which are formed toward the pixel electrode 171 based on the low molecular organic material. Also, the intermediate layer 172 may further include an electron transport layer (ETL) and an electron injection layer (EIL) which are formed toward the common electrode 173. In addition to these layers, the intermediate layer may further various types of layers. If the organic emission layer includes the high molecular organic material, the intermediate layer 172 may further include only the HTL toward the pixel electrode 171. The organic emission layer may form one unit pixel of sub pixels emitting red (R), green (G), and blue (B) lights. Alternatively, the organic emission layer may form one unit pixel of sub pixels emitting R, G, B, white (W) lights.

The pixel electrode 171 may include a metal having a light reflective property to be formed as a reflective electrode, and the common electrode 173 may have a light transmitting property. Therefore, the organic light-emitting display device may be formed as a top emission type. A metal having a low work function, e.g., Ag, Mg, Al, Pt, Pd, Au, Ni, Nd, Ir, Cr, Li, Ca, LiF/Ca, LiF/Al, or a compound thereof, may be deposited to form the reflective electrode.

The common electrode 173 may be formed by depositing Al to be a thin layer. Alternatively, the common electrode 173 may be formed by depositing a compound of Ag and Mg to be a thin layer. The common electrode 173 may have a thickness of about 100 Å or less to have the light transmitting property. The common electrode 173 includes the first and second common electrodes 173a and 173b. The first and second common electrodes 173a and 173b may include the same material. However, the first common electrode 173a is thinner than the second common electrode 173b to improve a processing property when forming contact holes H1 and H2 that will be described later.

The organic light-emitting display device is classified into a top emission type and a bottom emission type according to a realization direction of an image. In the top emission type, the image is realized from the pixel electrode 171 toward the common electrode 173. In the bottom emission type, the image is realized from the common electrode 173 toward the pixel electrode 171. The top emission type has a higher aperture ratio than the bottom emission type. The common electrode 173 is used as a transparent electrode such as an Indium Tin Oxide (ITO) in order to realize an image toward a front. However, the transparent electrode mostly has a high resistance, and thus an IR drop phenomenon occurs. Therefore, the common electrode 173 may have the light transmitting property and include a metal having a relative low resistance like Ag, Mg, or the like. However, the common electrode 173 is formed on a front surface of the substrate 110 and has a relatively thin thickness as described above in order to improve the light transmissivity. Therefore, an IR drop phenomenon may still occur due to a resistance.

Accordingly, in order realize a top emission type having a higher aperture ratio and lower a high resistance of the common electrode 173, in the organic light-emitting display device according to one embodiment, the auxiliary electrode 190 formed in the second area A2 of the substrate 110 forms a contact area contacting the common electrode 173, in more detail, the second common electrode 173b.

The auxiliary electrode 190 is formed on the same layer as the pixel electrode 171 and is formed of the same material as the pixel electrode 171. The auxiliary electrode 190 is formed as the same process as the pixel electrode 171, and thus the total number of processes is not increased. For the contact between the auxiliary electrode 190 and the common electrode 173, a contact hole may be formed to expose the auxiliary electrode 190. For example, a contact hole H1 of the intermediate layer 172 and a contact hole H2 of the first common electrode 173a are formed to expose the auxiliary electrode 190. The contact holes H1 and H2 are formed after the intermediate layer 172 including the organic emission layer and the first common electrode 173a are formed. The auxiliary electrode 190 contacts the second common electrode 173b through the contact hole (e.g., the contact holes H1 and H2) to improve the IR drop phenomenon. The second common electrode 173b may be relatively thicker than the first common electrode 173a within a range that does not hinder the light transmitting property. Through this structure, a resistance of the second common electrode 173b contacting the auxiliary electrode 190 may be minimized to effectively improve the IR drop phenomenon.

Furthermore, the contact holes H1 and H2 of the organic light-emitting display device according to one embodiment are formed after the intermediate layer 172 and the first common electrode 173 are formed, thereby minimizing an occurrence of a leakage current caused by an unstable interface of the intermediate layer 172 and particles formed when the contact holes H1 and H2 are formed. This will be described in more detail later with reference to FIGS. 8 and 11. A method of manufacturing the organic light-emitting display device according to an embodiment will now be described in detail with reference to FIGS. 2 through 7. The method includes a process of forming the contact holes H1 and H2 and a process of allowing the auxiliary electrode 190 to contact the second common electrode 173b.

FIGS. 2 through 7 are cross-sectional views illustrating a method of manufacturing the organic light-emitting display device, according to an embodiment of the present invention.

Figure 2:
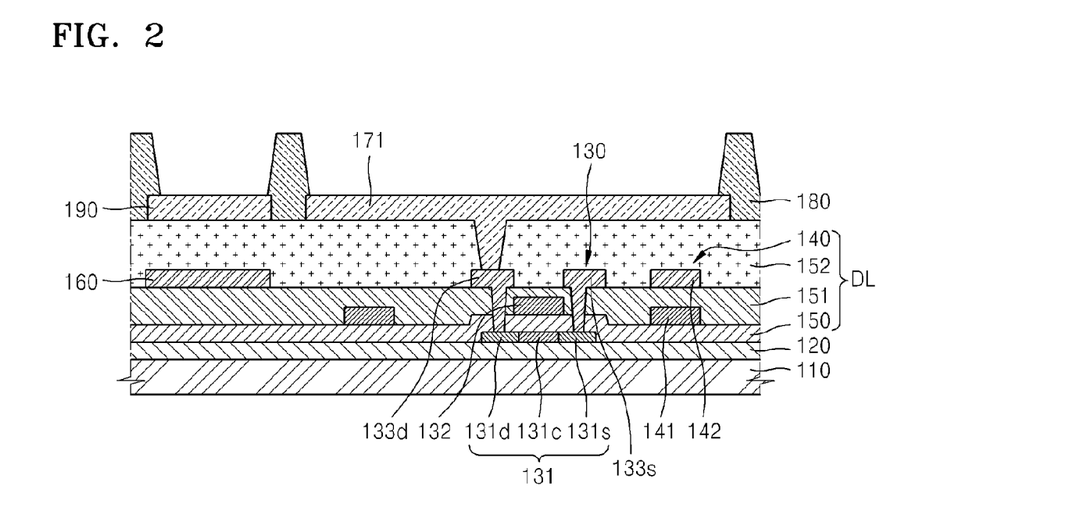
FIGS. 2 through 7 are cross-sectional views illustrating a process of manufacturing an organic light-emitting display device according to an embodiment of the present invention.

Referring to FIG. 2, the substrate 110 including first and second areas may be provided. The buffer layer 120 and the DL layer are formed on the substrate 110.

In more detail, the buffer layer 120, a semiconductor layer for forming the active layer 131, the gate insulating layer 150, and a first metal layer (not shown) are sequentially formed on the substrate 110. And then, the first metal layer is patterned to form the gate electrode 132 and the first electrode 141 of the capacitor 140.

The semiconductor layer may be formed of amorphous silicon or polysilicon. The amorphous silicon may be crystallized to form the polysilicon. The amorphous silicon may be crystallized according to various methods such as a rapid thermal annealing (RTA) method, a solid phase crystallization (SPC) method, an excimer laser annealing (ELA) method, a metal induced crystallization (MIC) method, a metal induced lateral crystallization (MILC) method, a sequential lateral solidification (SLS) method, etc. According to another embodiment, the semiconductor layer may include an oxide semiconductor as described above. An inorganic insulating layer such as SiNx or SiOx may be deposited according to a plasma enhanced chemical vapor deposition (PECVD) method, an atmosphere pressure CVD (APCVD), method, a low pressure CVD (LPCVD), or the like to form the gate insulating layer 150.

The first metal layer is patterned to form the gate electrode. The gate electrode 132 is used as a self-aligning mask to dope the semiconductor layer with n-type or p-type dopant in order to form the active layer 131 including the source and drain areas 131s and 131d and the channel area 131c interposed between the source and drain areas 131s and 131d.

The first interlayer insulating layer 151 is deposited, and then a second metal layer (not shown) is formed and patterned to form the source and drain electrodes 133s and 133d, the second electrode 142 of the capacitor 140, and the line layer 160.

The first interlayer insulating layer 151 may be formed of one or more organic insulating materials selected from the group consisting of polyimide, polyamide, acryl resin, benzocyclobutene, and phenol resin according to a spin coating method or the like. The first interlayer insulating layer 151 may be formed of an inorganic insulating material such as $SiN_x$ or $SiO_x$ according to a PECVD method, an APCVD method, an LPCVD method, or the like. Alternatively, an organic insulating layer and an inorganic insulating material may alternate with each other to form the first interlayer insulating layer 151.

The second interlayer insulating layer 152 is deposited, and then a third metal layer (not shown) is formed and patterned to form the pixel electrode 171 in a position corresponding to the first area and the auxiliary electrode 190 in a position corresponding to the second area. The pixel electrode 171 is electrically connected to the drain electrode 133d through an opening formed in the second interlayer insulating layer 152.

Like the first interlayer insulating layer 151, the second interlayer insulating layer 152 may include an organic insulating material and/or an inorganic insulating material. The third metal layer may be formed by depositing material selected from the group consisting of Ag, Mg, Al, Pt, Pd, Au, Ni, Nd, Ir, Cr, Li, Ca, LiF/Ca, LiF/Al, or a compound thereof. Since the third metal layer is patterned to simultaneously form the pixel electrode 171 and the auxiliary electrode 190, an additional process is not required, and the auxiliary electrode 190 and the pixel electrode 171 are formed of the same material on the same layer.

A pixel defined layer (PDL) 180 is formed between the pixel electrode 171 and the auxiliary electrode 190.

The PDL 180 may be formed of one or more organic insulating materials selected from the group consisting of polyimide, polyamide, acryl resin, benzocyclobutene, and phenol resin according to a spin coating method or the like. The PDL 180 may be formed of an inorganic insulating material selected from $SiO_2$, $SiN_x$, $Al_2O_3$, $CuO_x$, $Tb_4O_7$, $Y_2O_3$, $Nb_2O_5$, and $Pr_2O_3$ in addition to an organic insulating material as described above. The PDL 180 may be formed in a multilayer structure in which an organic insulating material and an inorganic insulating material alternate with each other.

After the PDL 180 is entirely formed, a mask process is performed to form the opening in order to expose the auxiliary electrode 190 and the pixel electrode 171. The PDL 180 has a predetermined thickness to widen a gap between an edge of the pixel electrode 171 and the common electrode 173 of FIG. 1 in order to prevent an electric field from being concentrated on the edge of the pixel electrode 171. Therefore, a short between the pixel electrode 171 and the common electrode 173 is prevented.

Figure 3:
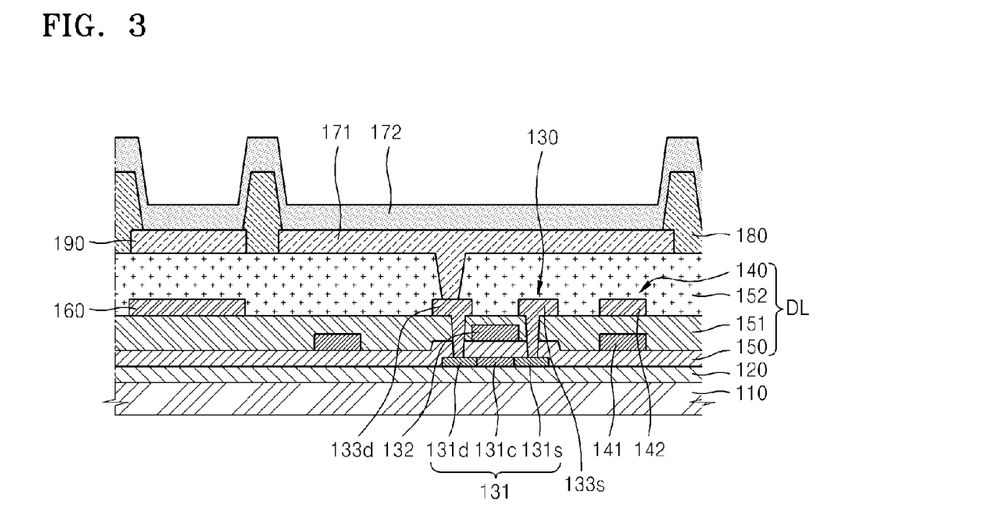

Referring to FIG. 3, the intermediate layer 172 including the organic emission layer is formed on entire parts of the pixel electrode 171 and the auxiliary electrode 190. The intermediate layer 172 is formed in the opening exposing the pixel electrode 171 and the auxiliary electrode 190 and may be deposited according to an evaporation method by using a low or high molecular organic material in a vacuum.

If the organic emission layer includes a low molecular organic material, the intermediate layer 172 may further include the HTL and the HIL which are formed toward the pixel electrode 171 based on the low molecular organic material. Also, the intermediate layer 172 may further include the ETL and the EIL which are formed toward the common electrode 173. In addition to these layers, various types of layers may be further included. If the organic emission layer includes a high molecular organic material, the intermediate layer 172 may further include only the HTL toward the pixel electrode 171 as described above.

Figure 4:
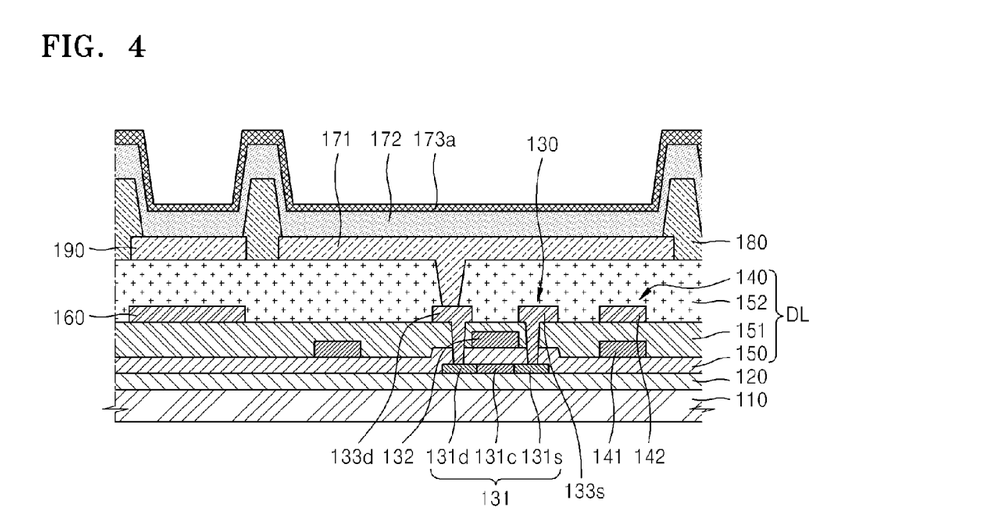

Referring to FIG. 4, the first common electrode 173a is formed on the intermediate layer 172.

The first common electrode 173a may be formed of Al or may be formed to include Ag or Mg. For example, Al may be deposited in a vacuum to form the first common electrode 173a. According to another embodiment, Ag and Mg may be simultaneously deposited in a vacuum to form the first common electrode 173a. The first common electrode 173a may be thinner than the second common electrode 173b to improve a processing property when forming the second contact hole H2.

Figure 5:
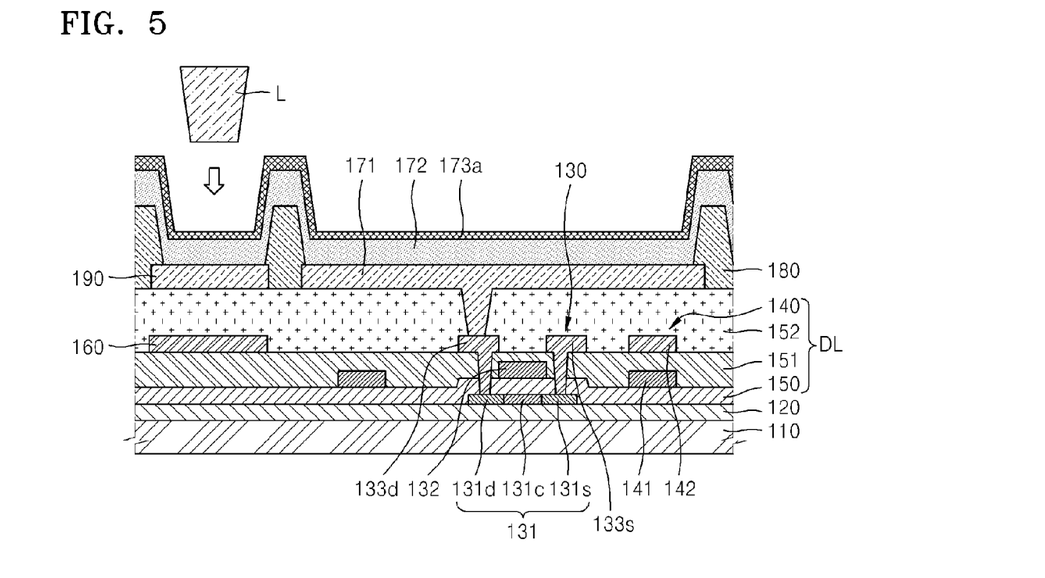
Figure 6:
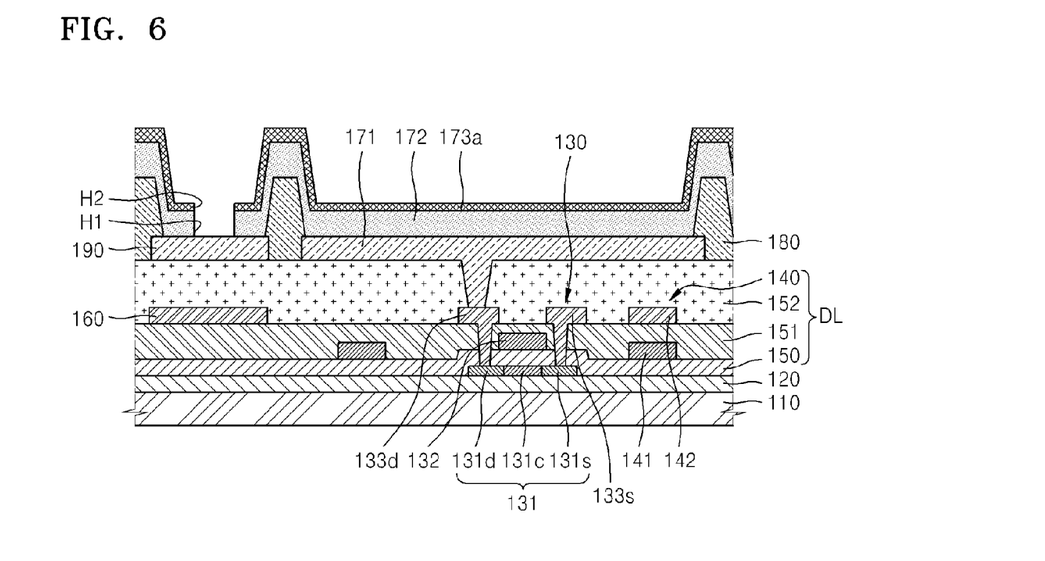

Referring to FIGS. 5 and 6, the contact holes (e.g., contact holes H1 and H2) are formed to expose the auxiliary electrode 190.

According to a laser drilling method, the contact holes H1 and H2 are formed in the intermediate layer 172 and the first common electrode 173a, respectively. In order to control particles generated when forming the contact holes H1 and H2, in an atmosphere of an inert gas such as nitrogen or argon, the first contact hole H1 penetrating the intermediate layer 172 and the second contact hole H2 penetrating the first common electrode 173a may be formed by using a laser L. The first and second contact holes H1 and H2 are simultaneously formed by using the same laser L, and thus sizes of the first and second contact holes H1 and H2 may be substantially the same.

If the contact holes H1 and H2 are formed by using the laser L in a vacuum atmosphere, it is difficult to control the particles generated when forming the contact holes H1 and H2. Therefore, the contact holes H1 and H2 may be formed in an atmosphere of an inert gas. However, as a large portion of the organic emission layer is exposed to the inert gas, an interface of the organic emission layer, i.e., an interface of the organic emission layer contacting the inert gas, becomes unstable, thereby generating a leakage current. Also, a life and an efficiency property of the organic light-emitting display device are lowered.

However, according to an embodiment, the first common electrode 173a is formed, and then the contact holes H1 and H2 are formed. Therefore, an area of the organic emission layer exposed to the inert gas is only an exposed degree of the organic emission layer through the contact holes H1 and H2. Therefore, the unstability of the interface of the organic emission layer is minimized, and the generation of the leakage current is minimized.

Figure 7:
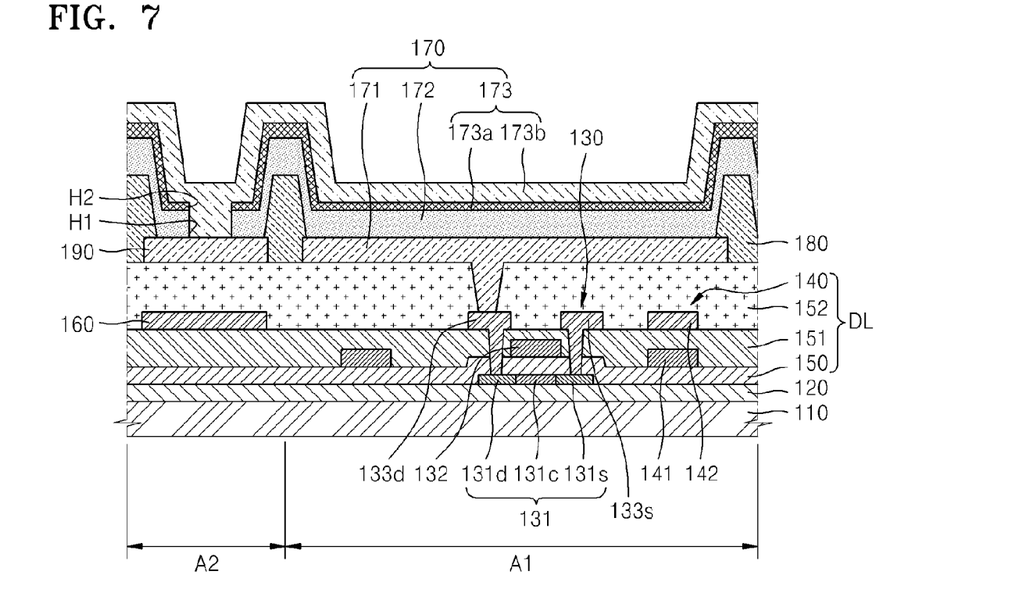

Referring to FIG. 7, the second common electrode 173b is formed on the first common electrode 173a to contact the auxiliary electrode 190 through the contact holes H1 and H2.

The second common electrode 173b may be formed of Al or may be formed to include Ag and Mg. For example, by depositing Al in a vacuum, the second common electrode 173b may be formed. According to another embodiment, Al and Mg may be simultaneously deposited in a vacuum to form the second common electrode 173b.

The common electrode 173 including the first and second common electrodes 173a and 173b is to have a light transmitting property, and thus increasing a thickness of the common electrode 173 is limited. However, the second common electrode 173b contacting the auxiliary electrode 190 may be thicker than the first common electrode 173a within a range that does not hinder the light transmitting property, to prevent an electric resistance from being increased.

Properties of the organic light-emitting display device of the present invention and of an organic light-emitting display device that is a comparison example will now be described with reference to FIGS. 8 through 11.

Figure 8:
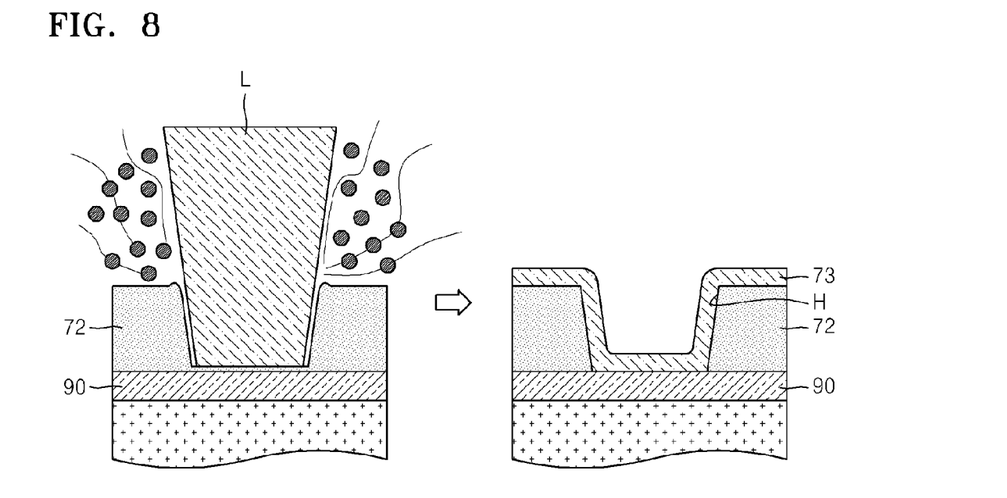
FIG. 8 is a schematic cross-sectional view illustrating an organic light-emitting display device as a comparison example.

FIG. 8 is a cross-sectional view illustrating a part corresponding to a second area of an organic light-emitting display device that is a comparison example.

Referring to FIG. 8, an organic emission layer 72 is formed on an auxiliary electrode 90 in a vacuum, a contact hole H is formed in an atmosphere of an inert gas by using a laser drilling method to penetrate the organic emission layer 72, and then a common electrode 73 is formed in a vacuum. Therefore, the organic light-emitting display device of the comparison example is different from the organic light-emitting display devices of the present invention in this point.

Figure 9:
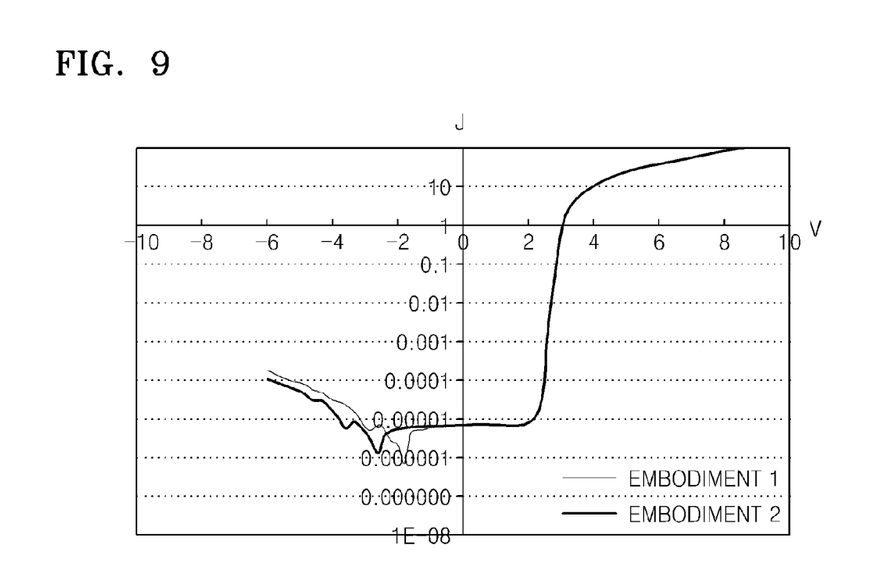
FIG. 9 is a graph illustrating leakage current density-voltage (J-V) properties of an organic light-emitting display device according to embodiments of the present invention.
Figure 10:
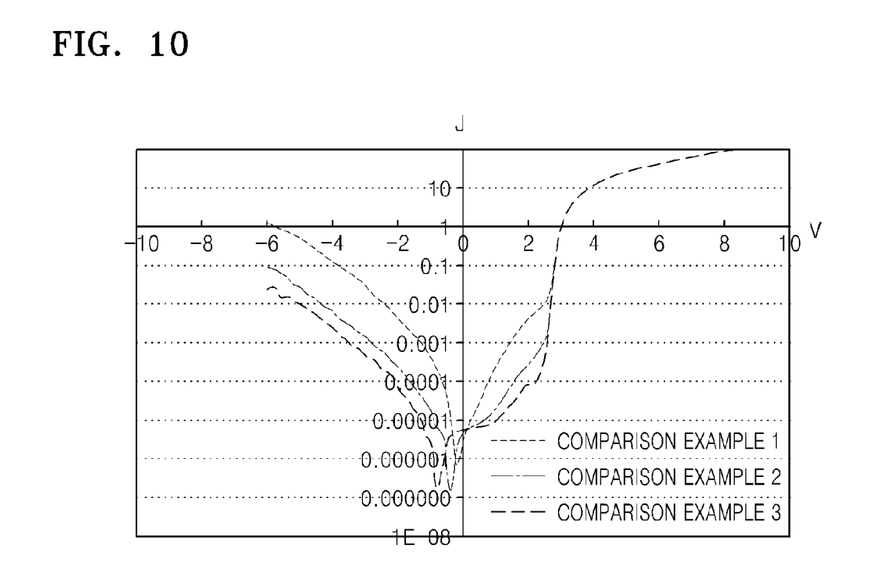
FIG. 10 is a graph illustrating leakage current density-voltage (J-V) properties of an organic light-emitting display device as comparison examples.
Figure 11:
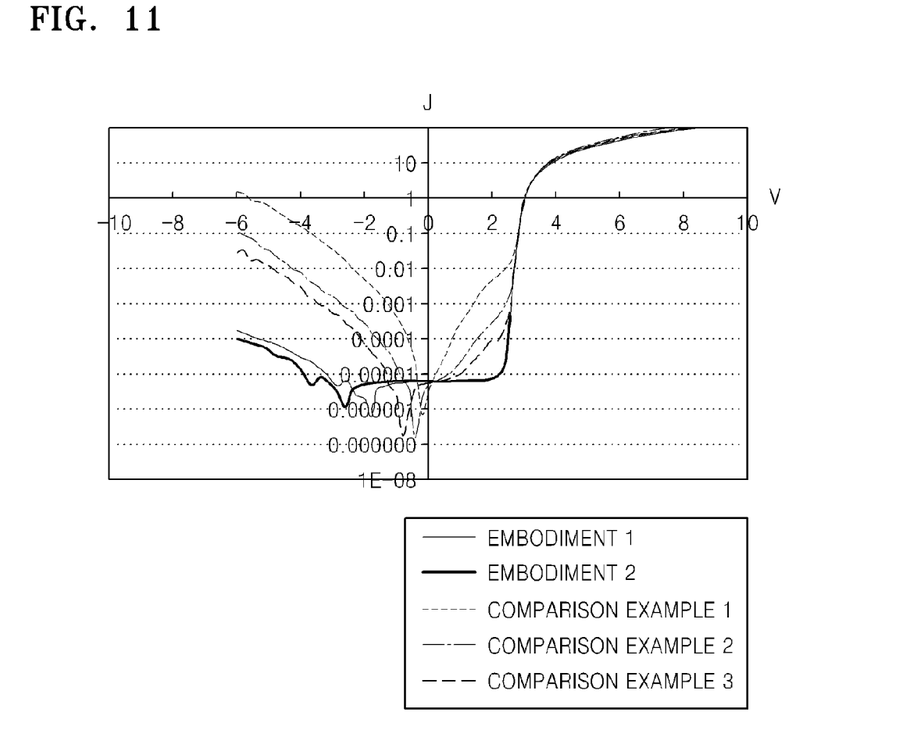
FIG. 11 is a graph illustrating leakage current density-voltage properties of an organic light-emitting display device according to embodiments of the present invention and leakage current density-voltage (J-V) properties of an organic light-emitting display device as comparison examples.

FIG. 9 is a graph illustrating leakage current density-voltage (J-V) properties of an organic light-emitting display device according to embodiments of the present invention. FIG. 10 is a graph illustrating leakage current density-voltage (J-V) properties of an organic light-emitting display device as comparison examples. FIG. 11 is a graph illustrating leakage current density-voltage properties of an organic light-emitting display device according to embodiments of the present invention and leakage current density-voltage (J-V) properties of an organic light-emitting display device as comparison examples. In the graphs, a unit of a voltage is V, and a unit of a leakage current density is A/cm².

Referring to FIGS. 9 through 11, the organic light-emitting display device according to the embodiments of the present invention shows a relatively stable property without a leakage current.

Meanwhile, referring to FIGS. 10 through 11, as to the organic light-emitting display device as the comparison example, the graphs show V shapes and the leakage current density is greatly changed in a section in which a voltage is between 0V and 3V.

In the organic light-emitting display device according to an embodiment of the present invention, the intermediate layer 172 including the organic emission layer and the first common electrode 173a are formed, and then the contact hole is formed. Therefore, a deterioration of a property of the interface of the organic emission layer is minimized.

According to an embodiment of the present invention as described above, there may be provided a top emission type organic light-emitting display device in which an auxiliary electrode contacts a second common electrode to improve an aperture ratio and minimize an IR drop.

Also, there may be provided an organic light-emitting display device in which an organic emission layer and a first common electrode are formed, and then contact holes are formed to allow an auxiliary electrode to contact a second electrode in order to minimize a leakage current and realize a high-quality image.

While the present invention has been particularly shown and described with reference to certain embodiments thereof, it will be understood by those of ordinary skill in the art that various changes in form and details may be made therein without departing from the spirit and scope of the present invention as defined by the following claims.

What is claimed is:

1. An organic light-emitting display device comprising:
   a substrate comprising first and second areas;
   a pixel electrode formed in the first area of the substrate;
   an auxiliary electrode formed in the second area of the substrate;
   an intermediate layer comprising an organic emission layer and formed on the pixel electrode and the auxiliary electrode;
   a first common electrode formed on the intermediate layer; and
   a second common electrode formed on the first common electrode,
   wherein the second common electrode and the auxiliary electrode contact each other through a contact hole which penetrates the first common electrode and the intermediate layer formed on the auxiliary electrode and wherein the second common electrode directly contacts an upper surface of the auxiliary electrode.

2. The organic light-emitting display device of claim 1, wherein:
   the intermediate layer formed on the auxiliary electrode comprises a first contact hole exposing the upper surface of the auxiliary electrode; and
   the first common electrode formed on the upper surface of the auxiliary electrode comprises a second contact hole exposing the auxiliary electrode.

3. The organic light-emitting display device of claim 1, wherein a thickness of the second common electrode is larger than a thickness of the first common electrode.

4. The organic light-emitting display device of claim 1, wherein the auxiliary electrode is formed on the same layer as the pixel electrode.

5. The organic light-emitting display device of claim 1, wherein the auxiliary electrode comprises the same material as the pixel electrode.

6. The organic light-emitting display device of claim 1, wherein the first and second common electrodes have a light transmitting property and comprise magnesium (Mg) and silver (Al).

7. The organic light-emitting display device of clam 1, wherein the pixel electrode is a reflective electrode.

8. A method of manufacturing the organic light-emitting display device of claim 1, comprising:
   providing the substrate comprising first and second areas;
   forming the pixel electrode in the first area of the substrate;

forming the auxiliary electrode in the second area of the substrate;

forming the intermediate layer comprising the organic emission layer on the pixel electrode and the auxiliary electrode;

forming the first common electrode on the intermediate layer;

forming the contact hole in a position corresponding to the second area to expose the auxiliary electrode; and forming the second common electrode on the first common electrode so that the second common electrode contacts the auxiliary electrode through the contact hole and so that the second common electrode directly contacts an upper surface of the auxiliary electrode.

9. The method of claim 8, wherein the formation of the contact hole comprises:

simultaneously forming first and second contact holes, wherein the first contact hole penetrates the intermediate layer formed on the auxiliary electrode and the second contact hole penetrates the first common electrode formed on the auxiliary electrode.

10. The method of claim 9, wherein the first and second contact holes substantially have the same size.

11. The method of claim 8, wherein the formation of the contact holes is performed in an atmosphere of an inert gas.

12. The method of claim 8, wherein the formation of the contact hole comprises:

forming contact holes penetrating the first electrode and the intermediate layer formed on the auxiliary electrode by using a laser drilling method.

13. The method of claim 8, wherein the formation of the pixel electrode and the formation of the auxiliary electrode are simultaneously performed.

14. The method of claim 8, wherein the auxiliary electrode comprises the same material as the pixel electrode.

15. The method of claim 14, wherein the auxiliary electrode and the pixel electrode comprise a metal having a reflective property.

16. The method of claim 8, wherein the formation of the first common electrode and the formation of the second common electrode are performed in a vacuum.

17. The method of claim 8, wherein the formation of the second common electrode comprises:

forming the second common electrode thicker than the first common electrode.

18. The method of claim 8, wherein the formation of the first common electrode comprises:

forming the first common electrode comprising Mg and Al.

19. The method of claim 8, wherein the formation of the second common electrode comprises:

forming the second common electrode comprising Mg and Al.

20. The organic light-emitting display device of claim 1, wherein the contact hole is connected to the upper surface of the auxiliary electrode.

21. An organic light-emitting display device comprising:

a substrate comprising first and second areas;

a pixel electrode formed in the first area of the substrate;

an auxiliary electrode formed in the second area of the substrate;

an intermediate layer comprising an organic emission layer and formed on the pixel electrode and the auxiliary electrode;

a first common electrode formed on the intermediate layer; and a second common electrode formed on the first common electrode, wherein the second common electrode and the auxiliary electrode contact each other through a contact hole which penetrates the first common electrode and the intermediate layer formed on the auxiliary electrode, wherein the intermediate layer formed on the auxiliary electrode comprises a first contact hole exposing the auxiliary electrode, wherein the first common electrode formed on the auxiliary electrode comprises a second contact hole exposing the auxiliary electrode; and wherein the first and second contact holes are formed in substantially the same size.

22. An organic light-emitting display device comprising:

a substrate;

a thin film transistor (TFT) formed on the substrate comprising an active layer, a gate electrode, a source electrode, and a drain electrode;

an organic light-emitting diode (OLED) in which a pixel electrode, an intermediate layer, and a common electrode are stacked, wherein the pixel electrode is electrically connected to one of the source and drain electrodes, the intermediate layer comprises an organic emission layer, and the common electrode faces the pixel electrode and comprises first and second common electrodes; and an auxiliary electrode which is formed on the same layer as the pixel electrode, wherein the second common electrode and the auxiliary electrode contact each other through a contact hole which penetrates the first common electrode and the intermediate layer formed on the auxiliary electrode and wherein the second common electrode directly contacts an upper surface of the auxiliary electrode.

23. The organic light-emitting display device of claim 22, wherein a thickness of the second common electrode is larger than a thickness of the first common electrode.

24. The organic light-emitting display device of claim 22, wherein the auxiliary electrode and the pixel electrode comprise the same material.

25. The organic light-emitting display device of claim 22, wherein light from the OLED is emitted toward the common electrode.

26. The organic light-emitting display device of claim 22, wherein the contact hole is connected to the upper surface of the auxiliary electrode.

27. The organic light-emitting display device of claim 26, wherein the contact hole comprises:

a first contact hole formed on the intermediate layer on the auxiliary electrode exposes the upper surface of the auxiliary electrode; and a second contact hole formed on the first common electrode on the auxiliary electrode exposes the upper surface of the auxiliary electrode.

* * * * *